United States Patent [19]

Fierkens et al.

[11] Patent Number: 4,733,014
[45] Date of Patent: Mar. 22, 1988

[54] LEAD FRAME

[75] Inventors: Richardus H. Fierkens, Herwen; Dirk de Kler, Loosdrecht, both of Netherlands

[73] Assignee: ASM-Fico Tooling B.V., Netherlands

[21] Appl. No.: 498,144

[22] Filed: May 25, 1983

[30] Foreign Application Priority Data

May 26, 1982 [NL] Netherlands ............... 8202154

[51] Int. Cl.$^4$ ........................................... H01L 23/48
[52] U.S. Cl. .................................. 174/52 FP; 357/70; 264/272.17; 264/276; 361/421
[58] Field of Search ............ 174/52 FP; 264/272.17, 264/276; 357/70, 72, 74; 361/421; 29/588, 827

[56] References Cited

U.S. PATENT DOCUMENTS 4,490,902 1/1985 Eytcheson et al. ............... 29/588

FOREIGN PATENT DOCUMENTS 58-95851 6/1983 Japan ............................. 357/70

Primary Examiner—Arthur T. Grimley
Assistant Examiner—David A. Tone
Attorney, Agent, or Firm—Bernard, Rothwell & Brown

[57] ABSTRACT

A lead frame for applying micro-electronic elements thereon, which lead frame comprises a series of lead patterns disposed at mutually equal pitch distances, each consisting of a carrier plate lying on the axis of the frame for applying a micro-electronic element thereto, further of leads terminating a short distance from said carrier plate, said leads being connected to lands extending perpendicularly to the frame axis and disposed on either side of the carrier plate, said leads extending beyond said lands in mutually parallel relationship so as to form lead terminals, as far as the next land of the adjoining lead pattern and being connected thereto, while the parallel leads of adjoining patterns are shifted relatively to each other in transverse direction: the mutual distance between two lands associated with one lead pattern is equal to the width of the standardized resin envelope of the micro-electronic element, the lands being provided with cuts in a direction approximately parallel to the axis of the lead frame, said cuts extending form the land edge oriented towards the carrier plate and terminating a short distance from the opposite land edge.

3 Claims, 3 Drawing Figures

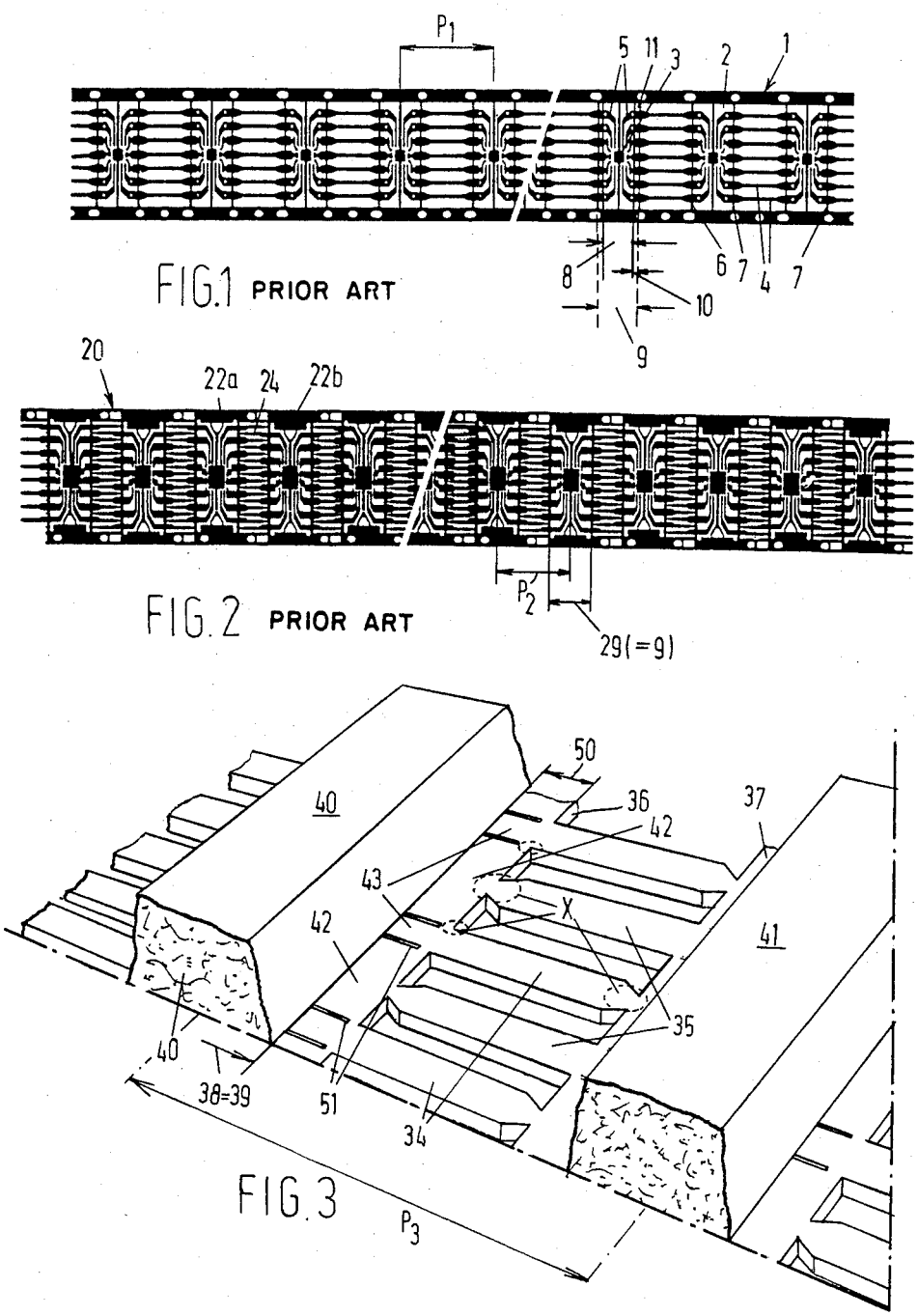

LEAD FRAME

The invention relates to a lead frame for applying micro-electronic elements thereto, said frame comprising a series of lead patterns disposed at mutually identical pitch distances, each consisting of a carrier plate lying on the axis of the frame for applying a micro-electronic element thereto, further of leads terminating a short distance from said carrier plate, said leads being connected to lands extending perpendicularly to the frame axis and disposed on either side of the carrier plate, said leads extending beyond said lands in mutually parallel relationship so as to form lead terminals.

Such lead frames are generally known stamping products, which are frequently employed in practice. On the carrier plate of each lead pattern there is provided an electronic micro-element, the terminations of which are soldered onto the separate leads of the lead pattern. After the application of the micro-electronic element, and the soldering of the terminations thereof, the element together with the soldered connections is encapsulated in a resin envelope, after which the resulting encapsulated micro-electronic element is detached from the lead frame by severing all connections of the encapsulated micro-electronic element to the lead frame. Also the lands on either side of the lead terminals are severed, thereby bending the lead terminals, enabling a convenient mounting of the encapsulated micro-electronic element on printing plates.

The lands disposed between the leads and the lead terminals have a double function, viz.:

they ensure the interconnection of the leads or lead terminals during the stamping of the lead frame, which connection is maintained until after the encapsulation of the micro-electronic element, and during encapsulation, which usually takes places in dies, the lands prevent the resin from flowing between and over the lead terminals, so that exclusively the micro-electronic element and the associated lead pattern are encapsulated.

Since said lands, after encapsulation, have to be severed mechanically, a minimal distance is required between the side edge of the resin envelope and the land edge facing said side edge. This distance is approximately 0.3 mm. In order to properly perform the sealing function between the two half-dies to be used in the encapsulation, and hence to absolutely prevent the resin from flowing beyond the lands, a given land width is required.

The required distance between the lands and the side edges of the envelope of the micro-electronic element results in that the spaces lying within said distance (squares) between the lead patterns are filled with resin, which resin, after the encapsulation of the micro-electronic element, has to be removed mechanically.

For shortening the pitch distance between the lead patterns, there is also known a lead frame wherein the lead terminals extend up to the next land of the adjoining lead pattern, being connected thereto, while the parallel leads of adjoining patterns are shifted relatively to each other in transverse direction. This lead frame is usually defined as an "interdigitated lead frame". As a result, the pitch distance between the lead patterns can be considerably shortened in that the lead terminals are no longer co-extensive. The pitch distance, relative to the above described lead pattern, is thus shortened by the length of one lead terminal. The mutual distance between the lands on either side of the lead pattern, however, is not affected thereby and there necessarily remains a minimal distance between the edge of the land and the side edge of the envelope of the encapsulated, micro-electronic element.

It is an object of the invention to further reduce the pitch distance of the lead patterns of a lead frame and the invention is characterized to this end in that the mutual distance between two lands associated with one lead pattern is maximally equal to the width of the standardized resin envelope of the micro-electronic element, said lands being provided with cuts in a direction approximately parallel to the axis of the lead frame, said cuts extending from the land edge oriented towards the carrier plate and terminating a short distance from the opposite land edge.

By providing the lands in this manner with precuts during the stamping of the lead frame, the distance between the carrier plate for the micro-electronic element and the edge of the land can be further reduced in that during the severing of the encapsulated element only the land portion farthest removed from the envelope need be severed. Consequently, the land may extend up to the side wall of the envelope In this manner, a mechanical finishing of the leads or lead terminals projecting from the envelope can be dispensed with.

By bringing the two lands associated with one lead pattern closer together, the pitch distance can be reduced by a distance approximately corresponding with $2 \times \frac{2}{3} \times$ the land width when the cuts are applied over $\frac{2}{3}$ part of the land width. This means a reduction of the pitch distance and hence a saving in material of about 8–10%. This saving in material is important, since the cost of manufacture of lead frames consists as to about 70% of material cost.

One embodiment of the lead frame according to the invention will now be described, by way of example, with reference to the accompanying drawings, in which:

FIG. 1 shows a known lead frame;

FIG. 2 shows a lead frame with shortened pitch distance (interdigitated lead frame); and FIG. 3 shows a part of a lead frame according to the invention with two encapsulated micro-electronic elements.

The known conductor frames, as shown in FIG. 1 and 2, will first be further explained for a better understanding of the invention. FIG. 1 shows a known and frequently employed lead frame 1, comprising uniformly interspaced lead patterns 2, in the centre of which there is provided a carrier plate 3 for applying a micro-electronic element thereto. The lead pattern 2 comprises a plurality of leads 5 terminating a short distance from the carrier plate 3, said leads extending to the lands 6,7 disposed on either side of the lead pattern 2. Adjacent the lands 6,7 the leads extend in parallel relationship, being extended for forming the lead terminals 4 associated with two adjoining lead patterns 2. The arrow $P_l$ indicates the pitch distance of the lead frame 1. The mutual distance of the lands 6,7 located on either side of a lead pattern 2 is indicated by arrow 9, while arrow 8 indicates the width of the resin-encapsulated micro-electronic element applied to the carrier plate 3. The distance 8 is less than the distance 9 and arrow 10 indicates the distance between the trailing edge of a land 7 and the leading edge of an envelope. Said distance 10 is primarily determined by tolerances and in practice is minimally 0.3 mm. Cutting the lands 6,7 on either side of the leads 5 or the lead terminals 4 should take place at some distance from the resin envelope, so as to prevent damage thereto.

On each carrier plate 3 of the lead frame 1, there is applied a micro-electronic element, the terminations of which are each connected to one lead 5 of a lead pattern 2 by means of soldering. The lead frame is then installed in a cast-in die, comprising two half-dies containing recesses for the envelope of the micro-electronic element. The two half-dies abut against those portions of the lead frame 1 that are not to be provided with a resin envelope. The lands 6,7 should ensure such a sealing that the resin space between the lead terminals 4 is not filled up. In doing so, it cannot be avoided that the space between the leads 5 adjacent a land 6,7 is filled with epoxy resin, as shown in FIG. 1 by 11. These epoxy squares 11 are subsequently to be removed mechanically.

After the application of the envelope, the encapsulated micro-electronic element is to be severed from the lead frame 1, with the lead terminals 4 being severed in the centre, as also are lands 6,7 on either side of the leads 5 or the lead terminals 4. Naturally, the edges of the lead frame 1 are also removed thereby.

FIG. 2 shows a slightly modified lead frame 20, the pitch distance $P_2$ of which is substantially reduced relative to the lead frame 1 of FIG. 1, viz. by a length corresponding with one lead terminal 24. This reduction of the pitch distance $P_2$ can be obtained by shifting the lead terminals 24 of two adjoining lead patterns 22a–22b in transverse direction, so that they are no longer coextensive but in side-by-side relationship. The mutual distance between the lands 6,7 is not changed thereby, as indicated by the arrow 29. The distance 29 is therefore equal to the distance 9 in FIG. 1.

FIG. 3 shows a part of a lead frame having two encapsulated adjoining micro-electronic elements, the envelopes of which are indicated by 40,41. At the right hand side of the envelope 40, there is provided the land 36 and at the left hand side of the envelope 41 is indicated the land 37. The lead terminals 34, associated with the element 40, extend up to, and are connected to, the land 37 associated with the element 41, while the lead terminals 35 associated with the latter element extend up to, and are connected to, the land 36. At 50 is indicated the minimal distance corresponding with the distance 10 in FIG. 1, i.e. mechanical cutting operations can only take place at a distance 50 from the side edge of the envelope 40.

The land 36 extends up to the sidewall of the envelope 40. The width 38 of the envelope 40, consequently, is equal to the distance 39 between the lands 36 on either side of the envelope 40. Said lands contain a series of cuts 51 terminating a short distance from the edge of the land 36. After the encapsulation of the micro-electronic elements, the lead frame need only be severed in the places indicated by circles X. The portions 42 of the land 36 are then no longer connected to the lead frame in any way whatever and fall out of it. The portions 43 located in alignment with the lead terminals 34, naturally remain in the lead frame.

To the land 37 and to all other lands of the lead frame applies the same as described in the above for the land 36. The cuts 51 can be applied in any place situated between two adjoining lead terminals 34,35, so that the width of the foot 43 of the lead terminal can be varied. Preferably, the cuts 51 are applied in the plane through the sidewalls of the terminals 34, of for the land 37 through the sidewalls of the terminals 35.

What we claim:

1. A lead frame for applying micro-electronic elements thereon, which lead frame comprises a series of lead patterns disposed at mutually equal pitch distances, each consisting of a carrier plate lying on the axis of the frame for applying a micro-electronic element thereto, further of leads terminating a short distance from said carrier plate, said leads being connected to lands extending perpendicularly to the frame axis and disposed on either side of the carrier plate, said leads extending beyond said lands in mutually parallel relationship so as to form lead terminals, as far as the next land of the adjoining lead pattern and being connected thereto, while the parallel leads of adjoining patterns are shifted relatively to each other in transverse direction, characterized in that the mutual distance between two lands associated with one lead pattern is equal to the width of the standardized resin envelope of the micro-electronic element, the lands being provided with cuts in a direction approximately parallel to the axis of the lead frame, said cuts extending from the land edge oriented towards the carrier plate and terminating a short distance from the opposite land edge.

2. A lead frame according to claim 1, characterized in that the cuts of the lands are co-extensive with the side edges of the lead terminals.

3. In a semiconductor device lead frame for a molded semiconductor device package and having at least a pair of finger leads and a dam bar therebetween for cooperation with a package molding die, the improvement wherein the dam bar is partially severed from each finger lead on its edge intended for facing a molded body of the package.

* * * * *